US009274291B2

(12) United States Patent
Cole et al.

(10) Patent No.: US 9,274,291 B2
(45) Date of Patent: Mar. 1, 2016

(54) OPTICAL FIBER CONNECTOR ASSEMBLY WITH PRINTED CIRCUIT BOARD STABILIZATION FEATURES

(71) Applicant: 3M INNOVATIVE PROPERTIES COMPANY, St. Paul, MN (US)

(72) Inventors: Brian M. Cole, Austin, TX (US); Donald G. Doss, Round Rock, TX (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 14/359,253

(22) PCT Filed: Nov. 27, 2012

(86) PCT No.: PCT/US2012/066628
§ 371 (c)(1),
(2) Date: May 19, 2014

(87) PCT Pub. No.: WO2013/082013
PCT Pub. Date: Jun. 6, 2013

(65) Prior Publication Data
US 2014/0348471 A1    Nov. 27, 2014

Related U.S. Application Data

(60) Provisional application No. 61/565,161, filed on Nov. 30, 2011.

(51) Int. Cl.
*G02B 6/36* (2006.01)
*H05K 1/11* (2006.01)
(Continued)

(52) U.S. Cl.
CPC ............... *G02B 6/42* (2013.01); *G02B 6/4201* (2013.01); *G02B 6/4246* (2013.01);
(Continued)

(58) Field of Classification Search
CPC ...... G02B 6/42; G02B 6/4201; G02B 6/4256; G02B 6/4249; H05K 1/117; H05K 1/144; H05K 1/148; H05K 1/189; H05K 2201/042; H05K 2201/2036; H05K 2201/10121; H05K 7/142; H05K 3/368
USPC ............... 385/88–92, 134–139, 147; 361/804
See application file for complete search history.

(56) References Cited

U.S. PATENT DOCUMENTS 4,779,674 A * 10/1988 McNulty ...................... 165/80.2
6,830,382 B1   12/2004 Deane
(Continued)

FOREIGN PATENT DOCUMENTS

EP   0245195   11/1987
JP   2001-094273   4/2001
(Continued)

OTHER PUBLICATIONS

International Search Report for PCT International Application No. PCT/US2012/066628, mailed on Feb. 26, 2013, 7 pages.

*Primary Examiner* — Akm Enayet Ullah
*Assistant Examiner* — Michael Mooney
(74) *Attorney, Agent, or Firm* — Clifton F. Richardson

(57) ABSTRACT

A plug connector for connecting a cable to a receptacle connector includes a housing (209) comprising an upper housing portion (212) assembled to a lower housing portion (211), the assembled portions defining a cavity (280) within the housing. One or more printed circuit boards (201, 202) are disposed in the housing cavity and a cable (100) is disposed in the housing cavity and connected to printed circuit boards. The assembled upper and lower housing portions define a first housing sidewall comprising an upper sidewall portion (221u) at the upper housing portion and a lower sidewall portion (221b) at the lower housing portion. The upper and lower sidewall portions define a gap (220-1) in the first housing sidewall at an interface between the upper and lower sidewall portions of the first housing sidewall. The gap extends only partially or at least partially along a length of the first housing sidewall.

13 Claims, 6 Drawing Sheets

(51) Int. Cl.
*G02B 6/42* (2006.01)
*H05K 1/14* (2006.01)

(52) U.S. Cl.
CPC ............ *G02B 6/4249* (2013.01); *G02B 6/4256* (2013.01); *H05K 1/144* (2013.01); *H05K 1/117* (2013.01); *H05K 2201/042* (2013.01)

(56) References Cited

U.S. PATENT DOCUMENTS

| 6,994,478 | B1 | 2/2006 | Chiu |
| 2004/0101259 | A1 | 5/2004 | Kilian |
| 2005/0178568 | A1 | 8/2005 | Ito |
| 2007/0071390 | A1 | 3/2007 | Tobiason |
| 2007/0232118 | A1 | 10/2007 | Wu |
| 2009/0297099 | A1 | 12/2009 | Benjamin |
| 2010/0027955 | A1 | 2/2010 | Parikh |
| 2010/0080518 | A1* | 4/2010 | Teo et al. .................. 385/92 |

FOREIGN PATENT DOCUMENTS

| WO | WO 98-40774 | 9/1998 |
| WO | WO 2011-056733 | 5/2011 |
| WO | WO 2013-081795 | 6/2013 |

* cited by examiner

OPTICAL FIBER CONNECTOR ASSEMBLY WITH PRINTED CIRCUIT BOARD STABILIZATION FEATURES

BACKGROUND

As compared with traditional wire-based networks, optical-fiber communication networks are capable of transmitting significantly more information at significantly higher speeds. Optical fibers, therefore, are being increasingly employed for communication networks.

SUMMARY

According to some embodiments a plug connector for connecting a cable to a receptacle connector includes a housing comprising an upper housing portion assembled to a lower housing portion. The assembled portions define a cavity within the housing. A plurality of printed circuit boards are disposed in the housing cavity along with a cable which is connected to the plurality of printed circuit boards. The assembled upper and lower housing portions define a first housing sidewall comprising an upper sidewall portion from the upper housing portion and a lower sidewall portion from the lower housing portion. The upper and lower sidewall portions define a gap in the first housing sidewall at an interface between the upper and lower sidewall portions of the first housing sidewall. The gap extends at least partially along a length of the first housing sidewall. In some cases, the gap extends only partially along the length of the first housing sidewall.

The assembled upper and lower housing portions define a second housing sidewall opposite the first housing sidewall, the second housing sidewall comprising an upper sidewall portion from the upper housing portion and a lower sidewall portion from the lower housing portion. The upper and lower sidewall portions define a gap in the second housing sidewall at an interface between the upper and lower sidewall portions of the second housing sidewall. The gap extends at least partially along a length of the second housing sidewall. In some cases, the gap in the second housing sidewall extends only partially along the length of the second housing sidewall.

The gap in the first housing sidewall is defined at an interface between a first lower edge of the upper sidewall portion and a first upper edge of the lower sidewall portion by the first lower edge not being complementary to the first upper edge. In some implementations, the first upper edge has a step at a first location along the first upper edge and the first lower edge does not have a complementary step at the same location along the first lower edge.

According to some implementations, a major surface of a first printed circuit board in the plurality of printed circuit boards is parallel to a major surface of a second printed circuit board in the plurality of printed circuit boards.

According to some aspects, the cable enters the housing cavity through a housing opening and is adapted to transfer a signal to and from the plurality of printed circuit boards. The cable can comprise a plurality of optical fibers.

In some cases, at least one printed circuit board in the plurality of printed circuit boards is held in place in the housing cavity by one or more elastically deformable pads. For example, at least one printed circuit board in the plurality of printed circuit boards is held in place in the housing cavity by a first plurality of deformable pads disposed on a top side of the at least one printed circuit board and a second plurality of deformable pads disposed on a bottom side of the at least one printed circuit board. The at least one printed circuit board in the plurality of printed circuit boards can include an optoelectronic component.

The above summary is not intended to describe each disclosed embodiment or every implementation.

BRIEF DESCRIPTION OF THE DRAWINGS

While the embodiments are amenable to various modifications and alternative forms, some details are shown by way of example in the drawings in which like reference numbers designate similar elements.

DETAILED DESCRIPTION

Optical fiber cables are designed to carry large amounts of information at high speeds. Each optical fiber cable may include one or more optical fibers that act as waveguides for the optical signal. Information transmitted via the optical fiber cables involves conversion of, electrical signals to optical signals at the transmit end, and then conversion of the optical signals to electrical signals at the receive end. The electrical-to-optical and/or optical-to-electrical conversions are handled by optoelectronic components that are configured to perform the conversions. In some configurations, the optoelectronic components are mounted on printed circuit boards housed within an optical fiber connector.

Figure 1A:
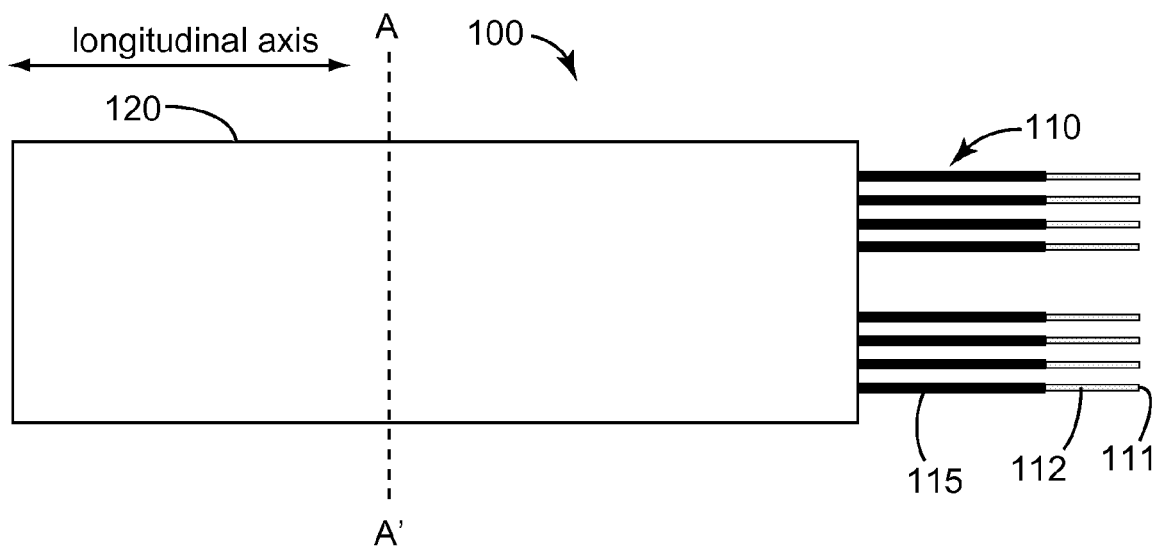
FIGS. 1A and 1B provide top and cross section views, respectively, of an optical fiber cable.
Figure 1B:
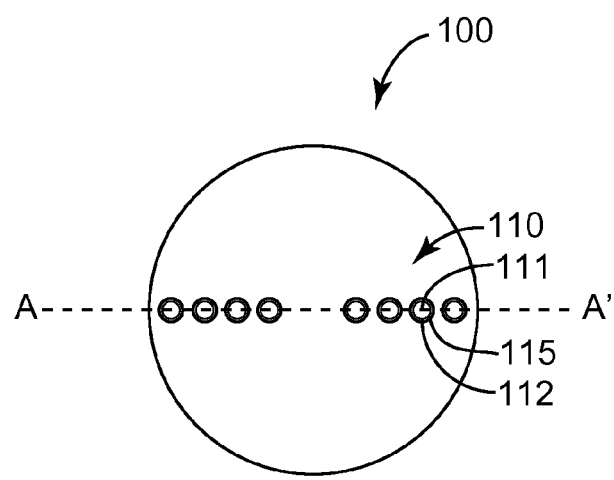

FIGS. 1A and 1B provide top and cross section views, respectively, of an optical fiber cable 100. In this example, the optical fiber cable 100 includes eight individual optical fibers 110, although more or fewer than eight optical fibers may be included in an optical fiber cable. Each optical fiber 110 includes a core 111 surrounded by a cladding 112. The optical fibers 110 are disposed within an outer jacket 120, and in some cases, the fibers 110 are moveable along the longitudinal axis within the jacket 120.

Figure 2A:
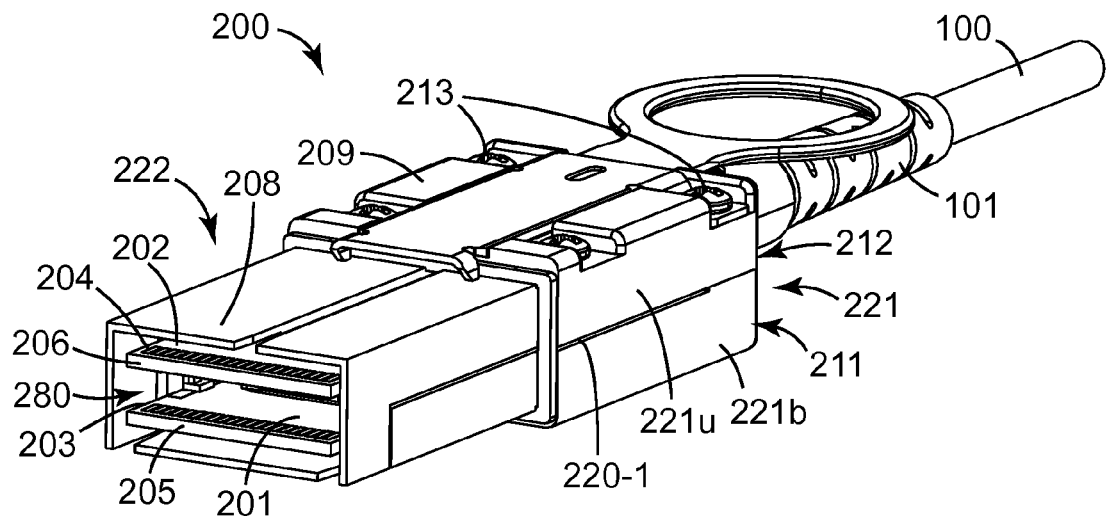
FIGS. 2A and 2B illustrate two views of an optical fiber plug connector in accordance with embodiments discussed herein.
Figure 2B:
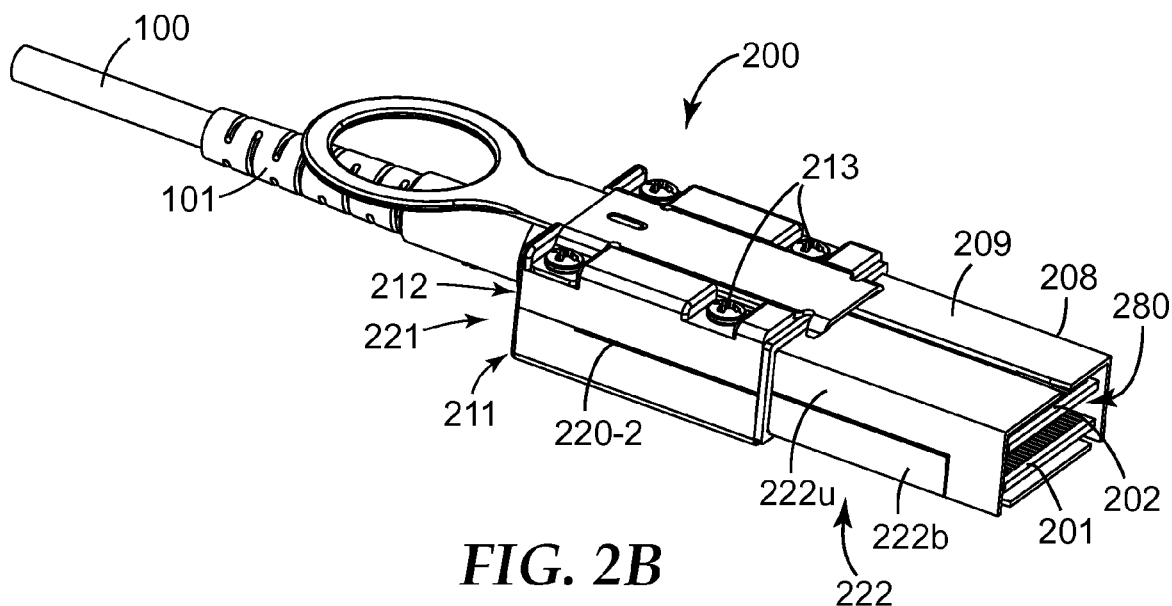
Figure 3C:
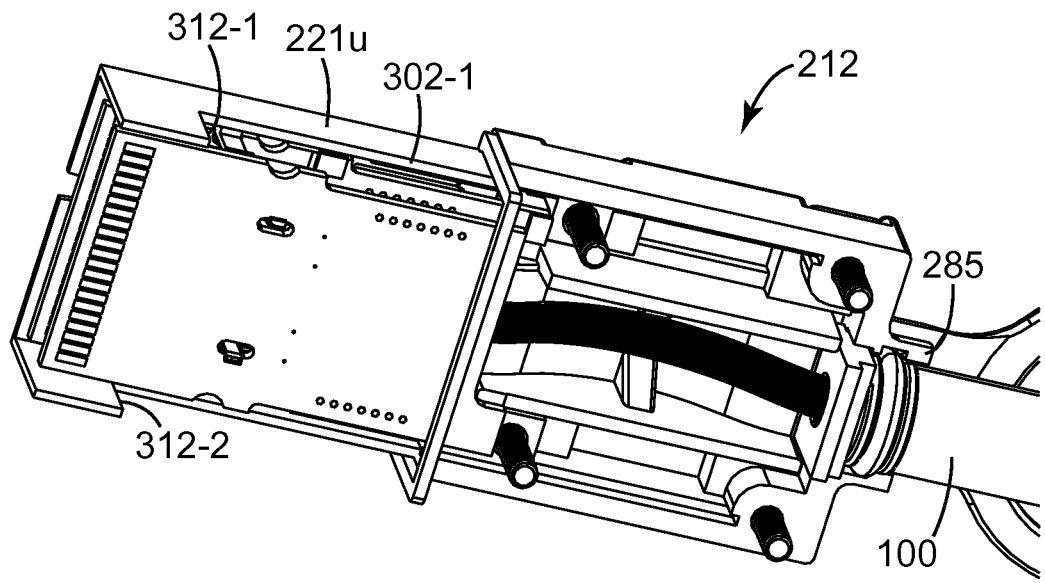
FIG. 3C is a view of the upper housing showing the upper sidewall portion of the first sidewall in accordance with some embodiments.
Figure 4A:
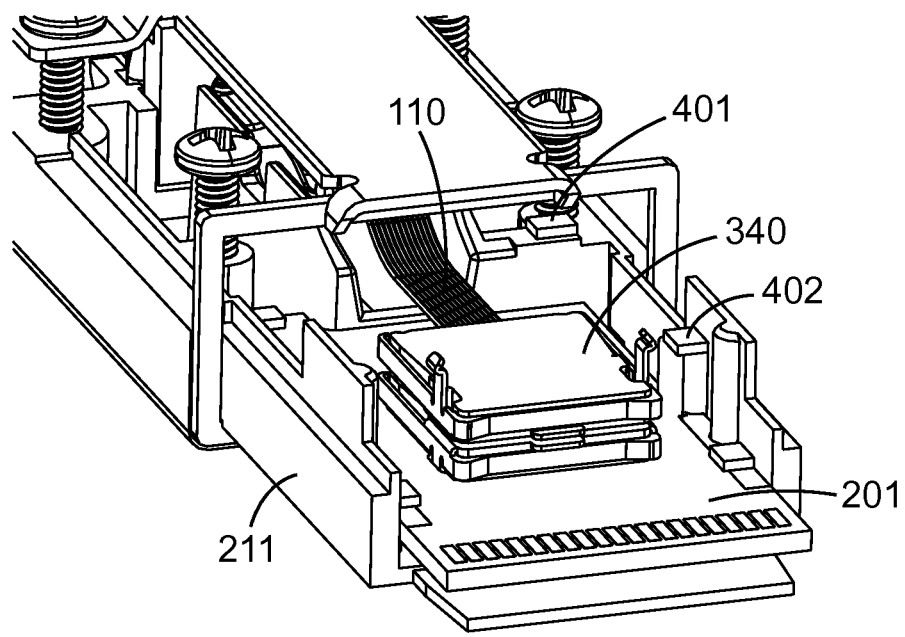
FIGS. 4A and 4B show elastically deformable pads disposed in the lower housing portion in accordance with embodiments discussed herein.
Figure 4B:
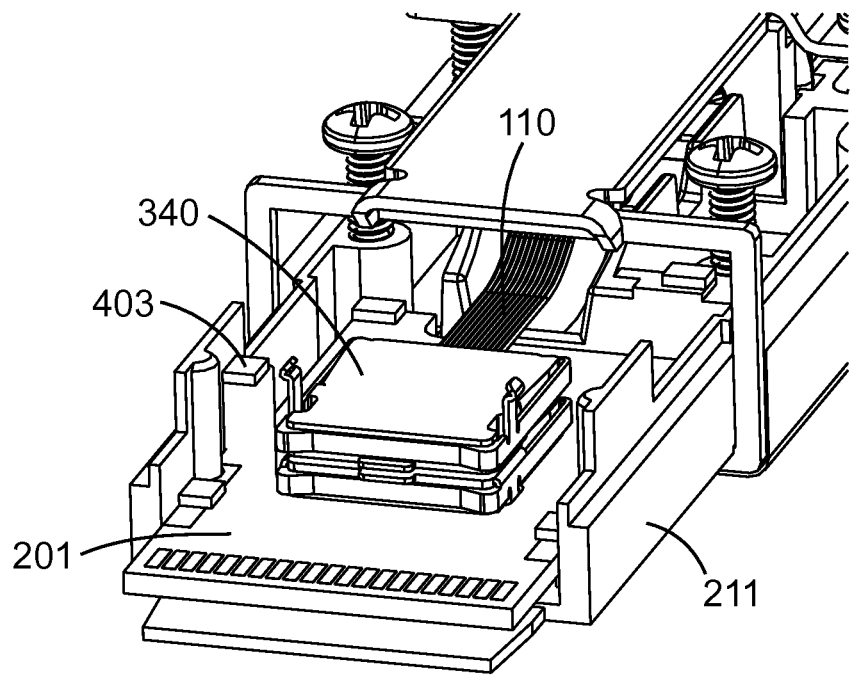

FIGS. 2A and 2B illustrate two views of an optical fiber plug connector 200. The connector 200 comprises a connector housing 209 which encloses a connector cavity 280. From the perspective of viewing the mating end 208 of the connector 200, FIG. 2A provides a view of the right side of the connector 200 and FIG. 2B provides a view of the left side of the connector 200. As best seen in FIG. 3C, the optical fiber cable 100 is inserted into the connector housing 209 and into the connector cavity 280 through a housing opening 285. As best seen in FIGS. 4A and 4B, the optical fibers 110 within the cable 100 may be coupled to one or more optoelectronic components 340 on one or more printed circuit boards (PCBs) disposed within the cavity 280. During operation, the optical fiber 100 may carry optical signals to and from one or both of the PCBs 201, 202. The mating edges 205, 206 of the two PCBs 201, 202 are shown at the mating end 208 of the connector 200. Each of the PCBs 201, 202 includes electrically conductive edge connector terminals 203, 204 arranged proximate the mating edge 205, 206 of the PCB 201, 202. The edge connector terminals 203, 204 are configured to mate with a socket in a complementary receptacle connector (not shown in FIG. 2). When multiple PCBs are present within the cavity 280 of the optical connector housing 209, all the PCBs may be the same, or one or more first PCBs may be different from one or more second PCBs. In some implementations, as illustrated in FIGS. 2A and 2B, the major surface of the first PCB 201 is substantially parallel to the major surface of the second PCB 202. In other implementations, the PCBs may have other orientations.

The connector housing 209 includes a lower housing portion 211 and an upper housing portion 212. The upper and lower housing portions 212, 211 can be assembled together to form the connector housing 209. In this example, the lower and upper housing portions 211, 212 are held together by screws 213, although other fastening approaches are possible. The connector housing 209 comprises a first sidewall 221 which is shown in FIG. 2A, and a second sidewall 222, which is shown in FIG. 2B. In this discussion, the first sidewall 221 is designated as the sidewall to the right when the connector 200 is viewed from the mating end 208 and the second sidewall is designated as the sidewall to the left when the connector 200 is viewed from the mating end 208. It will be appreciated that the terms "upper", "lower", "right", and "left" are all relative terms used for descriptive purposes. The connector may be oriented in any way, e.g. such as an orientation that makes the upper housing portion lower than the lower housing portion, etc.

The first sidewall 221 includes the first sidewall portion 221b of the lower housing portion 211 and the first sidewall portion 221u of the upper housing portion 212. The second sidewall 222 comprises the second sidewall portion 222b of the lower housing portion 211 and the second sidewall portion 222u of the upper housing portion 212. In some embodiments, a first gap 220-1 extends only partially or at least partially along the first sidewall 221. In some embodiments, a second gap 220-2 extends only partially or at least partially along the second sidewall 222. In some embodiments both sidewalls, 221, 222 have gaps 220-1, 220-2. The first gap 220-1 in the first sidewall 221 is defined at the interface between the first lower edge of the first upper sidewall portion 221u and the first upper edge of the first lower sidewall portion 221b. The first gap 220-1 defines the distance between the first lower edge (see, element 302-1 in FIG. 3C) of the first upper sidewall portion 221u and the first upper edge (see element 301-1 of FIG. 3A) of the first lower sidewall portion 221b. The first gap 220-1 is formed because first lower edge of the first upper sidewall portion 221u is not complementary to the first upper edge of the first lower sidewall portion 221b.

The second gap 220-2 in the second sidewall 222 is defined at the interface between the first lower edge of the second upper sidewall portion 222u and the first upper edge of the second lower sidewall portion 222b. The second gap 220-2 defines the distance between the second lower edge (see, element 302-2 in FIG. 3D) of the second upper sidewall portion 222u and the second upper edge (see element 301-2 of FIG. 3B) of the second lower sidewall portion 222b. The second gap 220-2 is formed because first lower edge of the second upper sidewall portion 222u is not complementary to the first upper edge of the second lower sidewall portion 222b. The gap reduces the effects of tolerance stackups within the connector housing. The first and/or second gaps 220-1, 220-2 may be uniform or non-uniform. In some cases, the first and/or second gaps are about 200 µm or in a range of about 20 to 400 µm.

In some configurations, one or both gaps 220-1, 220-2 may be uniform along the length of the connector housing 209. A uniform gap means that the distance defined by the gap between the upper housing portion and the lower housing portion is substantially uniform along the length of the gap. However, in some configurations, at least one gap 220-1, 220-2 may be non-uniform, meaning that at least at a first point along the gap, the distance between the upper and lower housing portions is different from the distance between the upper and lower housing portions at a second point along the gap 220-1, 220-2.

For example, in some implementations, the downward force created by screws 213 may cause the one or both gaps 220-1, 220-2 to be non-uniform. In this scenario, the distance between the top and bottom housing portions 212, 211 is smaller in the region where the screws 213 secure the two housing portions 212, 211 together than in the region nearer to the mating end 208 of the connector 200. For example, during assembly of the connector, a fixture may be used so that the overall height of the housing will be set for each assembly. Such a process may involves a zero gap closure at the rear set of screws and then a "tuning" of the front set of screws to set the overall height of the housing. The screws may be thread locked in place to lock in the final height with a variable gap distance.

In some embodiments, the force created by the screws 213 may distort one or both housing portions 211, 212 to create a non-uniform gap. In some implementations, one or both of the housing portions 211, 212 are intentionally designed to distort when force is applied to create a non-uniform gap.

In some implementations, the upper and lower connector housing portions 212, 211 may be fabricated so that even without the application of external force, at least one gap is non-uniform. For example, in some implementations, even without an applied external force, e.g. by the screws, the distance between the upper and lower housing portions 212, 211 is greater nearer the mating end 208 of the connector 200 than the distance between the upper and lower housing portions 212, 211 at the end of the connector 200 that receives the optical fiber cable 100. Alternatively, the connector housing 209 may be fabricated so that the gap distance between the upper and lower housing portions 212, 211 is smaller nearer the mating end 208 of the connector 200 when compared with the gap distance between the upper and lower housing portions 212, 211 at the end of the connector 200 that receives the optical fiber cable 100. In some configurations, the difference between the maximum and minimum gap distance for a sidewall may be about 400 µm or the minimum gap distance may be about 5% of the maximum gap.

Figure 3A:
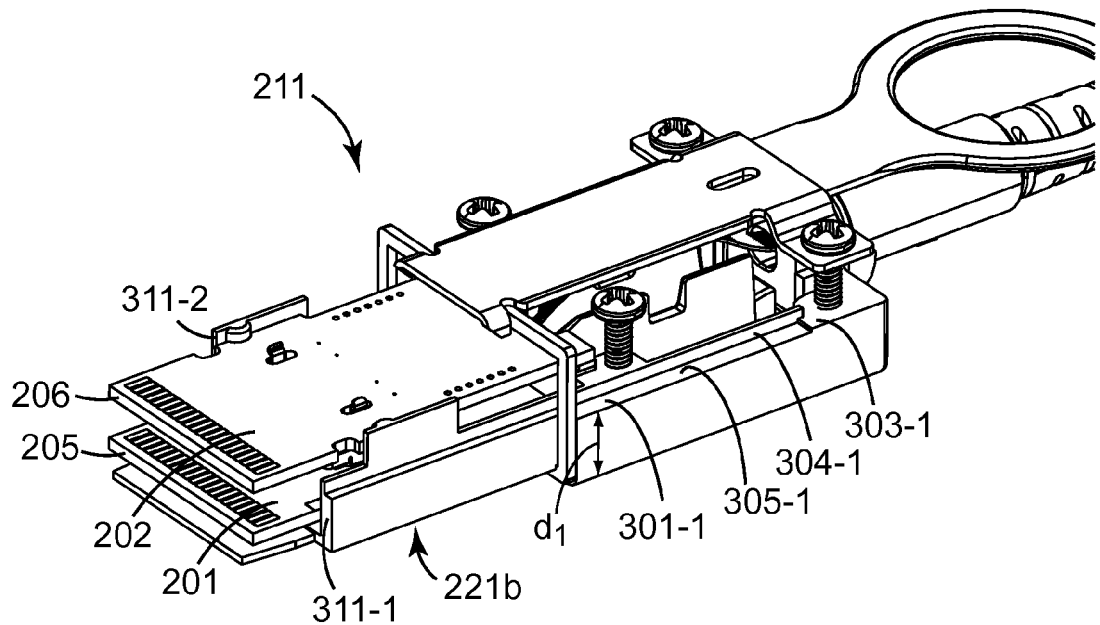
FIG. 3A is a view of the lower housing including the lower sidewall portion of the first sidewall in accordance with some embodiments.
Figure 3B:
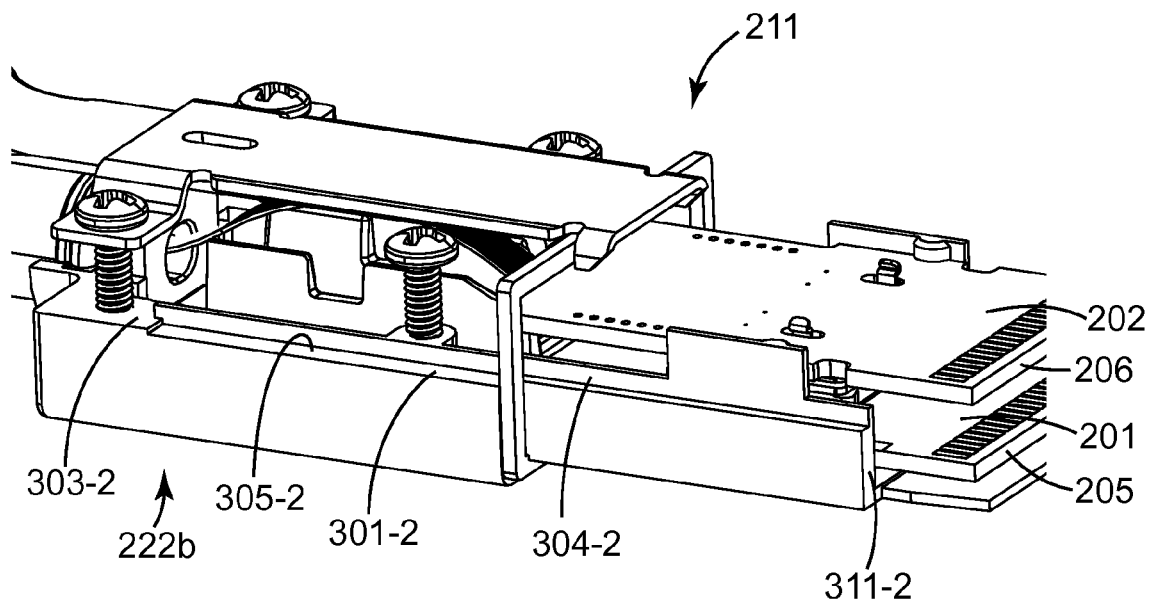
FIG. 3B shows a view of the lower housing including the lower sidewall portion of the second sidewall in accordance with some embodiments.
Figure 3D:
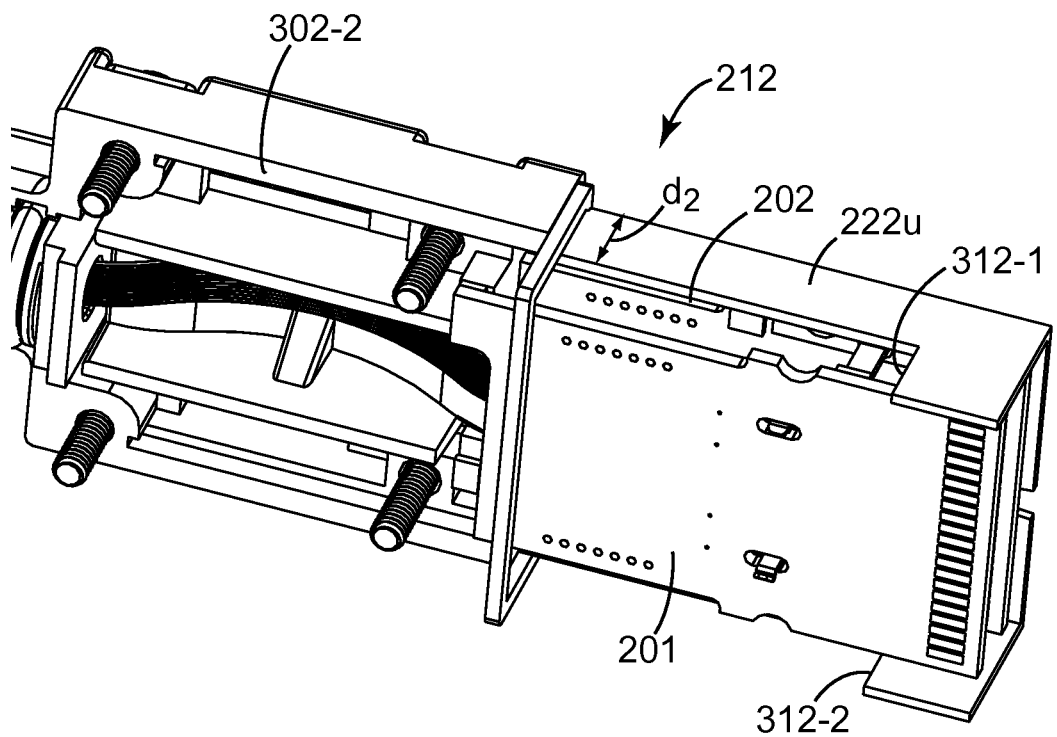
FIG. 3D is a view of the upper housing that shows the upper sidewall portion of the second sidewall in accordance with some embodiments.

FIGS. 3A and 3B are views of the lower housing portion 211, with FIG. 3A is a view of the lower housing 211 including the lower sidewall portion 221b of the first sidewall 221 and FIG. 3B showing a view of the lower housing 211 including the lower sidewall portion 222b of the second sidewall 222. FIG. 3C is a view of the upper housing 212 showing the upper sidewall portion 221u of the first sidewall and FIG. 3D is a view of the upper housing 212 that shows the upper sidewall portion 222u of the second sidewall 222.

In the particular configurations illustrated in FIGS. 3A through 3D, the housing 209 is configured to contain two PCBs 201, 202 within the housing cavity 280. Each of FIGS. 3A through 3D show both PCBs 201, 202.

The first upper edge 301-1 of the first lower sidewall portion 221b, is shown in FIG. 3A. The second upper edge 301-2 of the second lower sidewall portion 222b is shown in FIG. 3B. The first lower edge 302-1 of the first upper sidewall portion 221u of the second sidewall 222 is shown in FIG. 3C. The second lower edge 302-2 of the second upper sidewall portion 222u of the second sidewall 222 is shown in FIG. 3D. The first upper edge 301-1 has a step 303-1 at a first location along the first upper edge 301-1, however, the first lower edge 302-1 does not have a step at a corresponding location on the first lower edge 302-1. Similarly, the second upper edge 301-2 has a step 303-2 at a first location along the second upper edge 301-2, however, the second lower edge 302-2 does not have a step at a corresponding location on the second lower edge 302-2. The height of the steps 303-1, 303-2 may at least partially define the size of the gap. For example, the height of the step may be about 200 µm. At least one of the upper and lower sidewall portions may include a lip. For example, as depicted in FIGS. 3A and 3B the first and second upper edges include lips 304-1, 304-2. When assembled, the first lower edge 302-1 sits on the first shelf 305-1 outside lip 304-1 and the second lower edge 302-2 sits on the second shelf 305-2 outside lip 304-2.

As shown in FIGS. 3A through 3D, the first and second upper sidewall portions 221u, 222u, can have an L-shape, with the short portion of the L-shape being disposed at the mating edge 208 of the connector 200. In some cases, the thickness of the first 221b and second 222b lower sidewall portions, d1, is greater than the thickness of the long portion of the L shape, d2. However, in some cases, d1 is less than or equal to d2. Each of the first and second lower sidewall portions 221b, 222b have a truncated edge 311-1, 311-2, meaning that the first and second lower sidewall portions 221b, 222b do not extend all the way to the mating edges 205, 206 of the circuit boards 201, 202 at the mating end 208 of the connector. When the connector housing 209 is assembled, edges 312-1, 312-2 of the short portions of the L-shaped upper and lower sidewall portions 221u, 222u fit together with the truncated edges 311-1, 311-2 of the lower sidewall portions 221b, 222b.

Figure 5A:
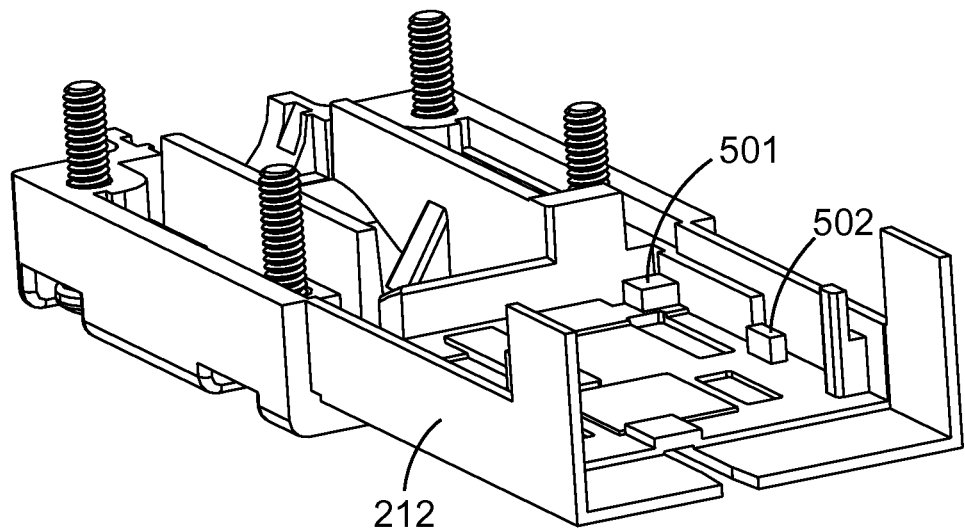
FIGS. 5A and 5B illustrate elastically deformable pads 501-504 disposed in the upper housing portion in accordance with embodiments discussed herein.
Figure 5B:
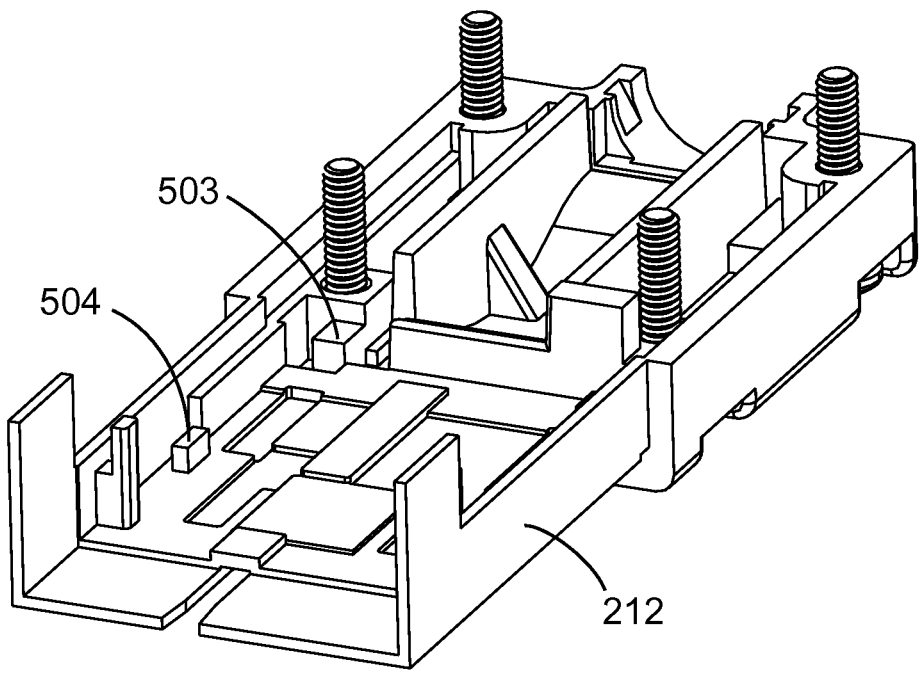

The connector housing 209 can include one or more elastically deformable pads that are configured to support and hold at least one PCB 201, 202 in place within the housing cavity. Suitable materials for the elastically deformable pads include silicone suitable for optoelectronic PCB applications. Suitable materials for the elastically deformable pads include elastomers such as silicone rubber, nitrile rubber, latex rubber, polyacrylic rubber, polyurethane, polybutadiene, and fluoroelastomers. Material characteristics of the pads include adequate compliance and modulus to provide sufficient retention force on the PCB, as well as negligibly small flow and good thermal and chemical stability so that the retention force will be maintained over the use life of the system. A high coefficient of sliding friction, potentially enhanced by texturing the surface of the elastomeric pad, may be employed to enhance gripping the PCB, The deformable pads may be disposed in the upper housing portion and/or in the lower housing portion. Deformable pads 401, 402, 403 disposed in the lower housing portion 211 are illustrated in FIGS. 4A and 4B. Deformable pads 501-504 disposed in the upper housing portion 212 are shown in FIGS. 5A and 5B. Pads 401, 402, 403 make contact with at least one PCB 202 (see, FIG. 3D) on a bottom side of the PCB 202 to provide support for the at least one PCB 202 and/or to hold the at least one PCB 202 in place. Pads 501, 502, 503, 504 make contact with a top side of the PCB 202 to provide support for and/or to hold the at least PCB 202 in place. Although three pads 401, 402, 403 are shown in the lower housing portion 211 and four pads are shown in the upper housing portion, in various configurations, more or fewer pads may be used.

The elastically deformable pads 401-403, 501-504 may operate cooperatively with the gap to hold one or more PCBs in place with the optimal amount of structural support while allowing sufficient tolerances in the connector housing. From connector housing to connector housing, the elastically deformable pads may be compressed and deformed by a variable amount with the variation in deformation of the elastically deformable pads causing differences in the gap size from connector housing to connector housing. The variation in gap size and/or amount of deformation of the elastically deformable pads allows the PCBs to be securely held in place with appropriate tolerances between adjacent structures.

Item 1 is a plug connector for connecting a cable to a receptacle connector, comprising:

a housing comprising an upper housing portion assembled to a lower housing portion, the assembled portions defining a cavity within the housing;

a plurality of printed circuit boards disposed in the housing cavity;

a cable disposed in the housing cavity and connected to the plurality of printed circuit boards;

wherein the assembled upper and lower housing portions define a first housing sidewall comprising an upper sidewall portion from the upper housing portion and a lower sidewall portion from the lower housing portion, the upper and lower sidewall portions defining a gap in the first housing sidewall at an interface between the upper and lower sidewall portions of the first housing sidewall, the gap extending at least partially along a length of the first housing sidewall.

Item 2 is the plug connector of item 1, wherein gap extends only partially along the length of the first housing sidewall.

Item 3 is the plug connector of item 1, wherein the assembled upper and lower housing portions define a second housing sidewall opposite the first housing sidewall, the second housing sidewall comprising an upper sidewall portion from the upper housing portion and a lower sidewall portion from the lower housing portion, the upper and lower sidewall portions defining a gap in the second housing sidewall at an interface between the upper and lower sidewall portions of the second housing sidewall, the gap extending at least partially along a length of the second housing sidewall.

Item 4 is the plug connector of item 3, wherein gap in the second housing sidewall extends only partially along the length of the second housing sidewall.

Item 5 is the plug connector of item 1, wherein the gap in the first housing sidewall is defined at an interface between a first lower edge of the upper sidewall portion and a first upper edge of the lower sidewall portion by the first lower edge not being complementary to the first upper edge.

Item 6 is the plug connector of item 5, wherein the first upper edge has a step at a first location along the first upper edge and the first lower edge does not have a complementary step at the same location along the first lower edge.

Item 7 is the plug connector of item 1, wherein a major surface of a first printed circuit board in the plurality of printed circuit boards is parallel to a major surface of a second printed circuit board in the plurality of printed circuit boards.

Item 8 is the plug connector of item 1, wherein the cable is adapted to transfer a signal to and from the plurality of printed circuit boards.

Item 9 is the plug connector of item 1, wherein the cable enters the housing cavity through a housing opening.

Item 10 is the plug connector of item 1, wherein at least one printed circuit board in the plurality of printed circuit boards is held in place in the housing cavity by one or more elastically deformable pads.

Item 11 is the plug connector of item 1, wherein at least one printed circuit board in the plurality of printed circuit boards is held in place in the housing cavity by a first plurality of elastically deformable pads disposed on a top side of the at least one printed circuit board and a second plurality of elastically deformable pads disposed on a bottom side of the at least one printed circuit board.

Item 12 is the plug connector of item 1, wherein the cable comprises a plurality of optical fibers.

Item 13 is the plug connector of item 1, wherein at least one printed circuit board in the plurality of printed circuit boards comprises an optoelectronic component.

Item 14 is an optical fiber connector, comprising:
a housing comprising an upper housing portion assembled to a lower housing portion, the assembled portions defining a cavity within the housing;
one or more printed circuit boards disposed in the housing cavity; and
one or more elastically deformable pads configured to hold at least one of the one or more printed circuit boards in place within the housing cavity.

Item 15 is the connector of item 14, wherein the one or more elastically deformable pads comprises:
a first plurality of elastically deformable pads disposed on a top side of the at least one printed circuit board; and
a second plurality of elastically deformable pads disposed on a bottom side of the at least one printed circuit board.

Item 16 is the connector of item 15, wherein:
the first plurality of elastically deformable pads disposed between the top side of the at least one printed circuit board and a top wall of the upper housing portion; and
a second plurality of elastically deformable pads disposed between the bottom side of the at least one printed circuit board and a lower wall of the lower housing portion.

The embodiments discussed in this disclosure have been illustrated and described herein for purposes of description of preferred embodiments, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electromechanical, and/or electrical arts will readily appreciate that the disclosed embodiments may be implemented with vary wide variations. This application is intended to cover any adaptations or variations of the preferred embodiments discussed herein.

The invention claimed is:

1. A plug connector for connecting a cable to a receptacle connector, comprising:
a housing comprising an upper housing portion assembled to a lower housing portion, the assembled portions defining a cavity within the housing;
a plurality of printed circuit boards disposed in the housing cavity;
a cable disposed in the housing cavity and connected to the plurality of printed circuit boards;
wherein the assembled upper and lower housing portions define a first housing sidewall comprising an upper sidewall portion from the upper housing portion and a lower sidewall portion from the lower housing portion, the upper and lower sidewall portions defining a gap in the first housing sidewall at an interface between the upper and lower sidewall portions of the first housing sidewall, the gap extending at least partially along a length of the first housing sidewall,
wherein the plug connector further comprises one or more elastically deformable pads configured to hold at least one of the plurality of printed circuit boards in place within the housing cavity,
wherein the one or more elastically deformable pads comprise:
a first plurality of elastically deformable pads disposed between a top side of the plurality of printed circuit boards and a top wall of the upper housing portion; and
a second plurality of elastically deformable pads disposed between a bottom side of the plurality of printed circuit boards and a lower wall of the lower housing portion.

2. The plug connector of claim 1, wherein gap extends only partially along the length of the first housing sidewall.

3. The plug connector of claim 1, wherein the assembled upper and lower housing portions define a second housing sidewall opposite the first housing sidewall, the second housing sidewall comprising an upper sidewall portion from the upper housing portion and a lower sidewall portion from the lower housing portion, the upper and lower sidewall portions defining a gap in the second housing sidewall at an interface between the upper and lower sidewall portions of the second housing sidewall, the gap extending at least partially along a length of the second housing sidewall.

4. The plug connector of claim 3, wherein the gap in the second housing sidewall extends only partially along the length of the second housing sidewall.

5. The plug connector of claim 1, wherein the gap in the first housing sidewall is defined at an interface between a first lower edge of the upper sidewall portion and a first upper edge of the lower sidewall portion by the first lower edge not being complementary to the first upper edge.

6. The plug connector of claim 5, wherein the first upper edge has a step at a first location along the first upper edge and the first lower edge does not have a complementary step at the same location along the first lower edge.

7. The plug connector of claim 1, wherein a major surface of a first printed circuit board in the plurality of printed circuit boards is parallel to a major surface of a second printed circuit board in the plurality of printed circuit boards.

8. The plug connector of claim 1, wherein the cable is adapted to transfer a signal to and from the plurality of printed circuit boards.

9. The plug connector of claim 1, wherein the cable enters the housing cavity through a housing opening.

10. The plug connector of claim 1, wherein at least one printed circuit board in the plurality of printed circuit boards is held in place in the housing cavity by one or more elastically deformable pads.

11. The plug connector of claim 1, wherein the cable comprises a plurality of optical fibers.

12. The plug connector of claim 1, wherein at least one printed circuit board in the plurality of printed circuit boards comprises an optoelectronic component.

13. An optical fiber connector, comprising:
a housing comprising an upper housing portion assembled to a lower housing portion, the assembled portions defining a cavity within the housing;
a plurality of printed circuit boards disposed in the housing cavity; and
one or more elastically deformable pads configured to hold at least one of the plurality of printed circuit boards in place within the housing cavity, the one or more elastically deformable pads comprising a first plurality of elastically deformable pads disposed between a top wall of the upper housing portion and a top side of the plurality of printed circuit boards, and a second plurality of elastically deformable pads disposed between a lower wall of the lower housing portion and a bottom side of the plurality of printed circuit boards.

* * * * *